United States Patent
Clinton

(10) Patent No.: US 7,974,144 B2
(45) Date of Patent: Jul. 5, 2011

(54) MEMORY WITH TUNABLE SLEEP DIODES

(75) Inventor: Michael Patrick Clinton, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 415 days.

(21) Appl. No.: 11/965,639

(22) Filed: Dec. 27, 2007

(65) Prior Publication Data
US 2008/0186794 A1 Aug. 7, 2008

Related U.S. Application Data

(60) Provisional application No. 60/882,913, filed on Dec. 30, 2006.

(51) Int. Cl.
*G11C 7/00* (2006.01)

(52) U.S. Cl. ......... 365/229; 365/154; 365/226; 365/228
(58) Field of Classification Search .............. 365/154 X, 365/226 X, 228 X, 229 O, 154, 226, 228, 365/229
See application file for complete search history.

(56) References Cited

U.S. PATENT DOCUMENTS

| 7,200,030 B2 * | 4/2007 | Yamaoka et al. ............. 365/154 |
| 7,307,899 B2 * | 12/2007 | Khellah et al. ............ 365/189.11 |

* cited by examiner

*Primary Examiner* — VanThu Nguyen
(74) *Attorney, Agent, or Firm* — Dawn V. Stephens; Wade James Brady, III; Frederick J. Telecky, Jr.

(57) ABSTRACT

A system and are described as to adjusting voltages in a memory device, while the device is in sleep mode, to prevent or minimize voltage or current leakage of the device.

17 Claims, 3 Drawing Sheets

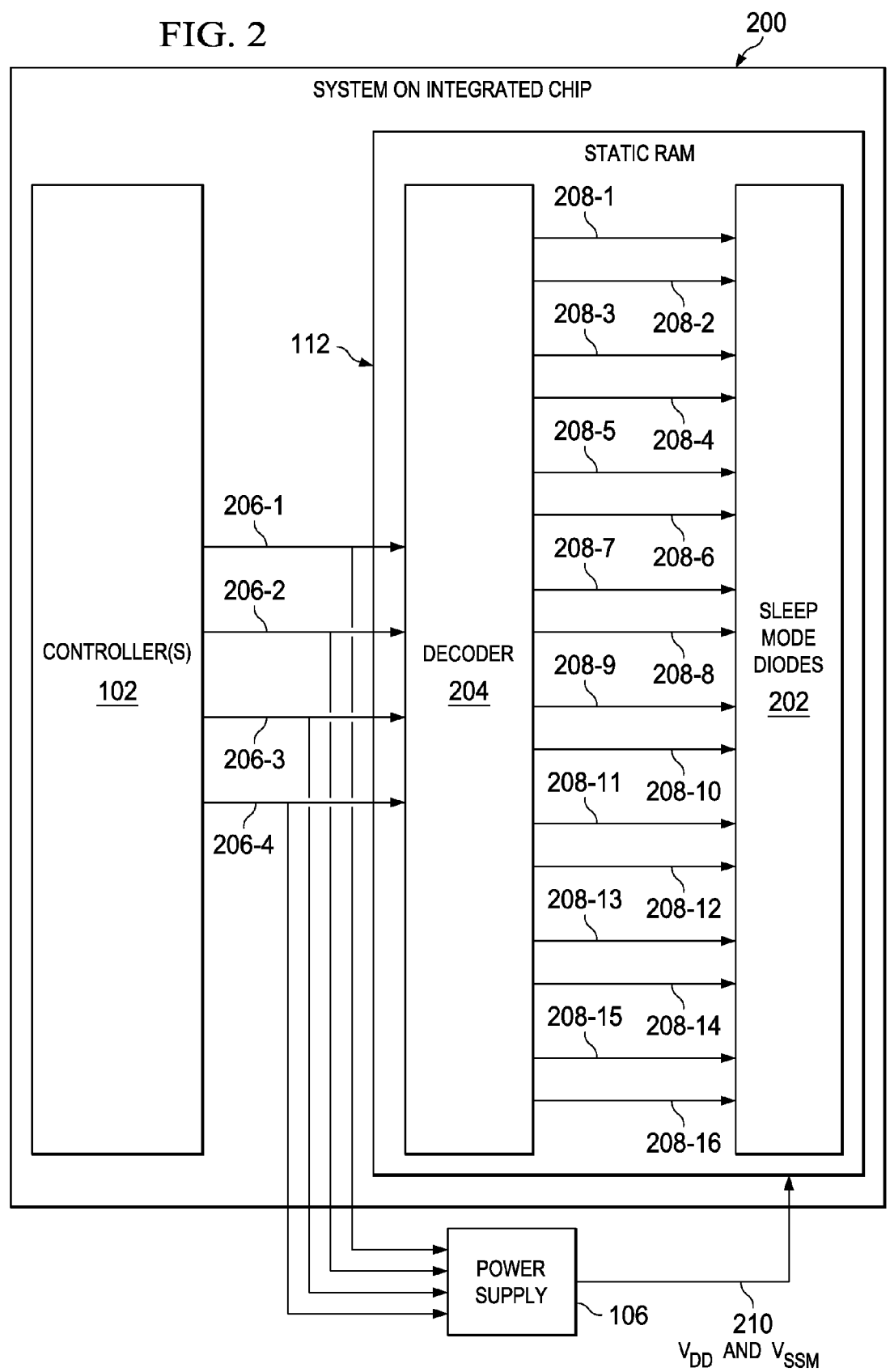

MEMORY WITH TUNABLE SLEEP DIODES

RELATED APPLICATIONS

The present application claims priority under 35 U.S.C. §119(e) to U.S. Provisional Application No. 60/882,913 filed Dec. 30, 2006, the disclosure of which is incorporated herein.

BACKGROUND

A considerable portion of portable electronic devices, such as cellular telephones, include memory devices. Therefore, a goal in the semiconductor and electronics industry is to make memory devices in portable electronic devices, smaller and more power efficient. For example, a challenge is to support trends to smaller sized memory devices, such as the industry trend from "65 nm" technology to "45 nm" technology. Since portable electronic devices rely almost exclusively on battery power, components such as memory devices should be power efficient, minimizing power consumption and power dissipation.

Semiconductor memories or memory devices can be characterized as volatile random access memories (RAMs) or nonvolatile read only memories (ROMs), where RAMs can include static RAM (SRAM) and dynamic RAM (DRAM). In general, SRAM and DRAM differ in the way they store a state of a bit in a bit cell of the memory. In SRAM, each bit cell can include circuitry (typically a transistor circuit) that implements a bi-stable latch. Such a transistor circuit can rely on transistor gain and positive feedback, where one of two possible states are assumed, i.e., "ON" or state 1, or "OFF" or state 2. An application of voltage to the bi-stable latch induces the state to change from one to the other. This allows a state written to a bit cell to be retained until the bit cell is reprogrammed.

An SRAM may be arranged as a matrix or array of memory cells or bit cells fabricated in an integrated circuit (IC) chip, where address decoding in the IC chip allows access to each bit cell for read/write functions. SRAM bit cells can include active feedback from cross-coupled inverters in the form of a latch to store or "latch" a bit of information. These SRAM bit cells can be arranged in rows, such that blocks of data (e.g., words, bytes, etc.) can be written or read simultaneously.

A particular challenge in memory device technology in general, and SRAM in specific, is variability in process and manufacture of memory devices. For example, there can be significant variances in the bit cells of SRAM devices that affect performance. The variances may further be complicated due to actual operating temperature changes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In an embodiment, a static random access memory (SRAM) device includes tunable sleep mode diodes that are turned on or off based on silicon process conditions of the SRAM device, such that voltage is adjusted to affect bit cells of the SRAM device while the SRAM is in a sleep mode condition.

BRIEF DESCRIPTION OF THE CONTENTS

FIG. 2 is a block diagram illustrating an exemplary system that supports tunable sleep diodes in a SRAM memory device.

DETAILED DESCRIPTION

An exemplary system and methods for implementing tuning of voltage in a static random access memory (SRAM) device are described. The exemplary system and methods include tuning sleep diodes controlling voltage of a SRAM device. The system and methods may be included in or part of a portable electronic device, for example a wireless communication device, such as a cellular telephone.

Figure 1:
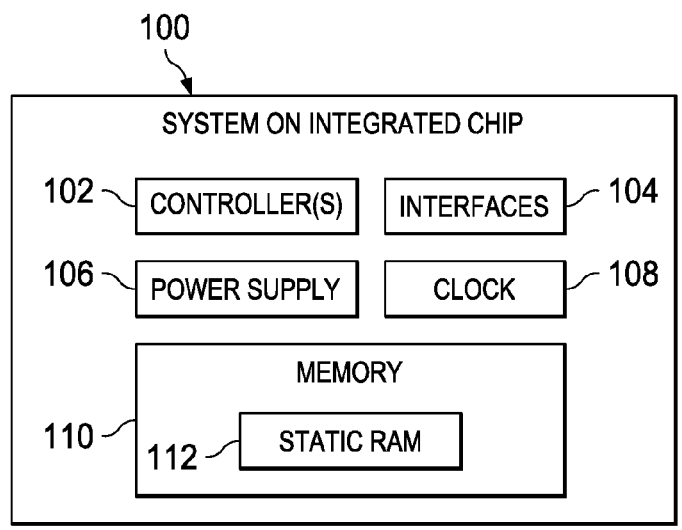
FIG. 1 is a block diagram illustrating an exemplary system that supports tunable voltage for a SRAM memory device.

FIG. 1 shows an exemplary system 100. In this example, system 100 is a system on an integrated chip or SOIC. Although, the system 100 is discussed in reference to distinct blocks or components, it is to be appreciated that other implementations may combine such components or functions of such components, rely on functionality from other components (either internal or external to system 100), forego particular components and/or functionality, and so on.

System 100 includes one or more processors or controller(s) 102. An example of such controller(s) 102 is SmartReflex™ technology offered by the Texas Instruments® Corporation. In general, SmartReflex™ technology is related to dynamic voltage and frequency scaling or DVFS. In a DVFS system, voltage may be dynamically adjusted in order to maintain a certain minimum frequency of operation. Typically. this is determined by the obtainable frequency for a device with the weakest or slowest process corner at the maximum voltage. For devices that produce stronger or faster process corners, a lower voltage may be operated to maintain the same frequency of operation. This is beneficial from a leakage power point of view as well, because devices with the stronger process will have shorter channel lengths and or lower threshold voltage, and therefore higher leakage. Therefore, reducing the power supply for these devices can reduce the leakage of these devices as well.

Another aspect of a DVFS system is to dynamically control the frequency of operation by lowering the voltage. For example, at peak operation the device may be required to operate at a maximum frequency. Therefore, the maximum voltage is to be applied. For certain other times the device, or portions of the device may be operating at a relatively low frequency. During such times, the voltage may be lowered, and still be able to achieve proper operation at the lower voltage and lower frequency.

Controller(s) 102, such as SmartReflex™ controller(s) may implement a feedback and control system to monitor temperature and operation of system 100 and its components. In other words, controller(s) 102 may include intelligent and adaptive hardware and software techniques that dynamically control voltage, frequency, and power based on device activity, modes of operation and temperature. Furthermore, controller(s) 102 are coupled to and may be configured to monitor and provide intra and inter communications, and to regulate power in the system 100. Interfaces 104 may be provided to support such communications. Interfaces 104 may include various communication input/output interfaces and communication busses or lines.

In this implementation, exemplary system 100 includes a power supply 106 which may be a component that receives power from an external source and stores the power to be used by system 100. Power supply 106 can include a regulated voltage or current supply. The system 100 can include a clock 108 used for various timing operations by system 100.

System 100 includes a memory component or memory 100. Memory 100 can include volatile and non volatile memory, such as ROM and RAM memory. Memory 100 is particularly accessed and controlled by controller(s) 102, and interfaces with other components in system 100. In particular, memory 110 receives power from power supply 106, communicates with or through interfaces 106, and receives clock or timing signals from clock 108. Memory 100 includes a static random access memory (SRAM) device or component, hereinafter referred to as SRAM 112. SRAM 112 may be configured as an array of bit cells. SRAM 112 may implement a particular size technology, such as 65 nm technology as known in the industry.

FIG. 2 shows a system 200 that implements tunable sleep diodes. The system 200 may implement controller(s) 102 as discussed above. In this example, the power supply 106 is external to system 200. System 200 includes SRAM 112 that includes a bank of sleep mode diodes 202 and a decoder 204.

In this example, controller(s) 102 provides bit word commands to power supply 106. Lines 206-1, 206-2, 206-3, and 206-4 may provide either a 1 or 0 bit value. Therefore, power supply 106 may receive any of 16 four bit words that correspond to a particular voltage value of 16 possible voltage values. The decoder 204 receives bit values from lines 206 as well, and provides instruction via bit lines 208-1 to 208-16, to turn "ON" or "OFF" particular sleep mode diodes in the bank of sleep mode diodes 202, as discussed in further detail below. Power supply 106 particularly regulates or provides voltage $V_{DD}$ and $V_{SSM}$ 210 to SRAM 112 as instructed by controller(s) 102.

SRAM 112 may be placed in sleep mode, where a minimum voltage may be required in order to assure that data is correctly maintained. For example, for 65 nm node technology, the minimum retention voltage may be on the order of 600 mV. In order to achieve minimum SRAM 112 leakage, a 600 mV potential is applied across a bitcell array of SRAM 112 during sleep mode. Sleep mode diodes 202 may be implemented to set the voltage. Therefore, potential across the bitcell array may vary with temperature and process. As discussed further below, tuning the sleep mode diodes 202 can use the same control signals from the controller 102, such as a SmartReflex™ controller.

Two different approaches may be used in supplying voltage to the SRAM 112 array. In a first approach typically referred to as "dual-rail" a constant voltage is supplied to the SRAM 112 array, for example, 1.0v. The power supply 106 may supply voltage to the rest of SRAM 112 and system 100. In this approach, sleep mode diodes 202 are tuned with the control bits from controller 102, where the control bits to try and maintain the retention or sleep mode voltage as close to 600 mV (for a 65 nm example) as possible.

In a second approach referred to as "single-rail", all power comes from power supply 106. Control of the retention or sleep mode voltage now is a two-dimensional problem based on process/temperature and voltage from power supply 106. For higher voltages, sleep mode diodes 202 can continue to be tuned, as in the "dual rail" approach, in order to maintain a retention or sleep mode voltage as close to 600 mV (for a 65 nm example) as possible. Eventually, at a strong or fast process corner, voltage may have to be lowered so far that sleep mode diodes 202 can no longer be used, because the minimum possible voltage will go below the 600 mV minimum. In this case sleep mode diodes 202, and the bit cell power supply may be connected directly to power supply 106. In a single-rail approach, there could be some threshold value of the controller 102 control bits which would determine when switching is made from a retention voltage set with sleep mode diodes 202, to when power supply 106 is directly used. In this example, header diodes for sleep mode diodes 202 may be used between power supply 106 and a bit cell $V_{DD}$ node; however, similar results may be accomplished if bit cell $V_{DD}$ is connected to the power supply 106, and footer diodes used to modulate the SRAM bitcell $V_{SS}$ ($V_{SSM}$).

The bank of sleep mode diodes 202 supports a low power sleep mode in SRAM 112 in order to avoid or minimize leakage power. Implementation of sleep mode in SRAMs may either include header or footer diodes to either lower the SRAM bit cell array $V_{DD}$ or raise SRAM bit cell array $V_{SSM}$ (i.e., $V_{DD}$ and $V_{SSM}$ 210), respectively. When the potential voltage across a SRAM bit cell is reduced and with the resulting back bias on the driver device (footer diode) or load device (header diode) SRAM bit cell array leakage may be reduced significantly, as discussed further below.

In an implementation, controller(s) 102 is connected to or receives feedback from a ring oscillator (not shown) or similar device/component. The ring oscillator or other device/component, measures and provides frequency of the system 200, where the frequency is proportionally related to the operation or process of the silicon of the system 200. A relatively higher frequency may infer a stronger silicon process for the system 200 (i.e., stronger silicon translates to the device running faster or at a higher frequency). A relatively lower frequency may infer a weaker silicon process for the system 200 (i.e., weaker silicon translates to the device running slower or at a lower frequency). In a particular application, $V_{DD}$ can be lowered for relatively stronger silicon, while $V_{DD}$ can be increased for relatively weaker silicon. With relatively stronger silicon, leakage can be higher. Therefore, by lowering $V_{DD}$, a large reduction in leakage current may be realized.

In this example, controller(s) 102 outputs the four bits at lines 206 to indicate a $V_{DD}$ value to power supply 106. The same four bits of lines 206 which correspond to a $V_{DD}$ may also be used to indicate whether to turn "ON" or "OFF" certain diodes in the bank of sleep mode diodes 202. For greater leakage (i.e., higher frequency), more diodes can be turned off, and for lower leakage (i.e., lower frequency), more diodes can be turned on.

Figure 3:
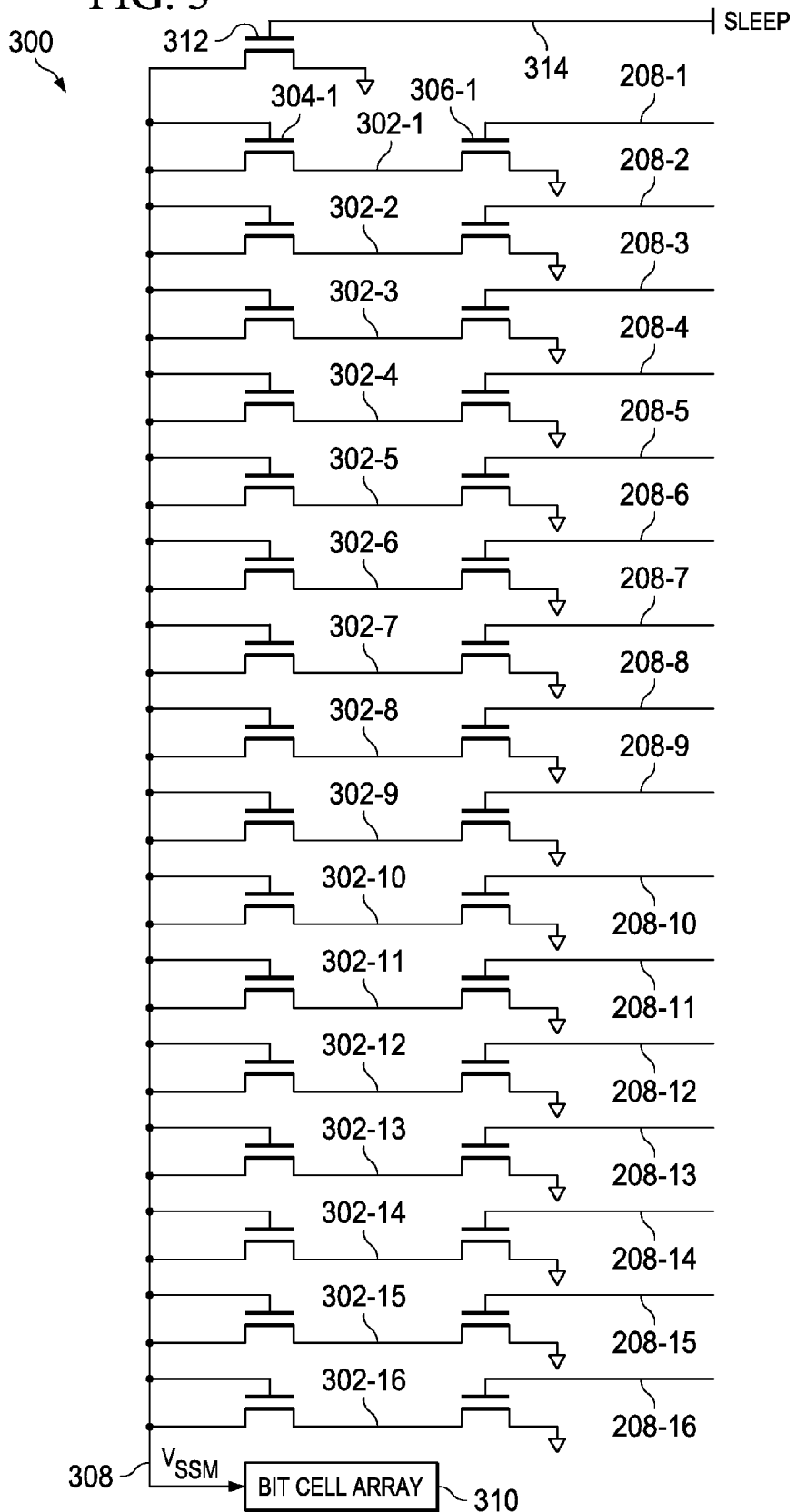
FIG. 3 is a block diagram illustrating exemplary tunable sleep diode bank in a SRAM memory device.

FIG. 3 shows an exemplary bank of sleep mode diodes 300, which may be implemented as or part of bank of sleep mode diodes 202. In this implementation, MOSFET transistors are described; however, it is to be appreciated that other technology may be used. In this example, pairs of transistors 302-1 to 302-16 are implemented. Using transistor pair 302-1 as an example, transistor pair 302-1 includes a transistor 304-1 that acts as a diode, turning "ON" or "OFF". The transistor pair 302-1 includes a transistor 306-1 that acts as a switch that turns the transistor 304-1 "ON" or "OFF." Switch or transistor 306-1 receives an "ON" or "OFF" signal from line 208-1. As described, lines 208 indicate whether a sleep diode (i.e., transistor 304) is turned "ON" or "OFF". In one embodiment, each of the diodes (transistors 304) is equally weighted or has the same value. In another embodiment, the diodes (transistors 304) may be weighted (e.g., binary weighted). In either embodiment, particular diodes (transistors 304) are turned "ON" or "OFF" to affect $V_{SSM}$ rail 308 value provided to bit cell array 310 of SRAM 112.

This example describes how $V_{SSM}$ 308 rail may be affected; however, a $V_{DD}$ value or $V_{DD}$ rail value, as described above, may also be affected using a slightly different configuration. In such an implementation, the diode pairs 302, can have diode (i.e., transistor 304) connected to the $V_{DD}$ rail, instead of the $V_{SSM}$ 308 rail. Therefore, the diodes or transistors 304 can be connected to either the $V_{DD}$ rail or $V_{SSM}$ 308 rail.

Part of reducing leakage is to provide a raised $V_{SSM}$ value across bit cells of the bit cell array 310. In other words, leakage may be reduced when $V_{SSM}$ is raised, reducing potential across the bit cells bit cell array 310. This relates to back bias, wherein the back terminals of the NMOS transistors are tied to a solid ground node of the silicon substrate. The solid ground node of the silicon substrate may be replaced with a $V_{SSM}$ node. For example, when the source node of the transistors is raised to a $V_{SSM}$ value is raised 300 mv to 400 mv above ground, such voltage translates to an equivalent back bias, and threshold voltage ($V_T$) is raised (i.e., increases $V_T$), further reducing leakage. When voltage at the $V_{SSM}$ node is raised, potential is reduced across the bit cells and back bias is introduced at the NMOS transistors.

In operation, SRAM 112 is taken in and out of sleep mode. In this implementation, a single NMOS device 312 is placed between $V_{SSM}$ 308 and across the diodes (transistors 304). NMOS device 312 acts as a shunt. When active (SRAM 112 "ON"), the shunt is on, shorting $V_{SSM}$ 308 to solid ground. The controlling signal is Sleep (NOT or bar) 314. When low, the SRAM 112 is in sleep mode, the shunt device (NMOS device 312) is turned "OFF", allowing $V_{SSM}$ 308 to float up to one diode drop above ground. Once $V_{SSM}$ 308 floats up to a diode drop, the diodes (transistors 304) start conducting and clamp $V_{SSM}$ 308 at that diode drop. When SRAM 112 is active, the shunt device (NMOS device 312) is turned "ON" and $V_{SSM}$ 308 is shorted to ground, and bit cells of bit cell array would have full potential across, allowing full read and write operation.

Figure 4:
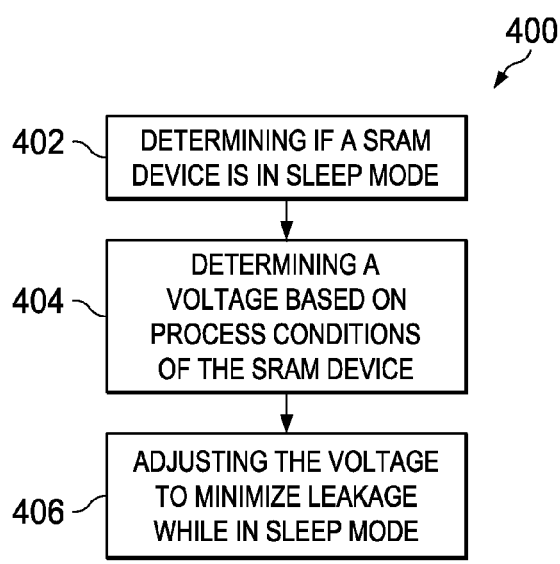
FIG. 4 is a flowchart illustrating a process to support voltage tuning for a SRAM memory device.

FIG. 4 shows a process 400 that provides for adjusting voltage in SRAM memory device. The process 400 is illustrated as a collection of blocks in a logical flow graph, which represent a sequence of operations that can be implemented in hardware such as described above. Although described as a flowchart, it is contemplated that certain blocks may take place concurrently or in a different order.

At block 402, a determination is made as whether a SRAM device is in sleep mode. If the device is active, there may be no particular need to minimize or reduce voltage leakage on the SRAM device. This is particularly the case, when effective read and write operations are of greater concern than voltage or current leakage. Typically, when in sleep mode, the SRAM device may make use of sleep diodes as described above to place the SRAM device in sleep mode. The condition of the device being in sleep mode may be directly be related to the need to prevent or minimize voltage or current leakage. As discussed, preventing or minimizing leakage may be preformed by tuning the sleep diodes.

At block 404, a determination is made as to a voltage based on present process or operating conditions of the SRAM device. Process or operating conditions can include inherent silicon die effects and operating temperature. As discussed, stronger silicon may infer higher operating frequencies and the ability to lower $V_{DD}$. The determination may be made using a feedback to a controller that adjusts a power supply based on measured process or operating conditions of the SRAM device, as discussed above.

At block 406, voltage is adjusted based on the determined voltage. The determined and adjusted voltage may either be $V_{DD}$ (which is decreased), or $V_{SSM}$ (which is increased to provide a greater potential across bit cells). The adjusting may be performed by activating/deactivating sleep mode diodes in a back of sleep mode diodes as discussed above. As discussed such sleep modes may be connected to either the $V_{DD}$ rail or the $V_{DD}$ rail, which are connected to a bit cell array of the SRAM device.

CONCLUSION

The above-described systems and methods adjusting voltage through tunable sleep mode diodes in a SRAM device. Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A system comprising:
   a controller; and
   a memory coupled to the controller, comprised of:
   a static random access memory (SRAM) device that includes tunable sleep mode diodes that are turned on or off based on process conditions of silicon of the SRAM device, wherein voltage is adjusted to affect bit cells of the SRAM device while the SRAM is in a sleep mode condition, wherein the controller implements a feedback to monitor the process conditions of the SRAM device.

2. The system of claim 1, wherein the controller controls power provided to the SRAM device.

3. The system of claim 1, wherein the controller turns on or off certain sleep mode diodes based on the process conditions of the SRAM device.

4. The system of claim 1, wherein the adjusted voltage is to a $V_{DD}$ rail connected to the tunable sleep mode diodes and the bit cells.

5. The system of claim 1, wherein the adjusted voltage is to a $V_{SSM}$ rail connected to the tunable sleep mode diodes and the bit cells.

6. The system of claim 1, wherein the tunable sleep mode diodes are equally weighted.

7. The system of claim 1, wherein the tunable sleep mode diodes are binary weighted.

8. A static random access memory (SRAM) device comprising:
   a bank of tunable sleep mode diodes; and
   a decoder that turns on or off certain sleep mode diodes in the bank of tunable sleep mode diodes to adjust voltage in the SRAM device, wherein the decoder receives commands from a controller that receives feedback based on process conditions of the SRAM device.

9. The SRAM device of claim 8, wherein the bank of tunable sleep mode diodes are either footer or header diodes.

10. The SRAM device of claim 8, wherein the bank of tunable sleep mode diodes is connected to and affects voltage at $V_{SSM}$ rail or a $V_{DD}$ rail, which are connected to an array of bit cells of the SRAM device.

11. The SRAM device of claim 8, wherein the bank of tunable sleep mode diodes are equally weighted and have the same effect on adjusting voltage in the SRAM device.

12. The SRAM device of claim 8, wherein the bank of tunable sleep mode diodes are binary weighted and have the different effects on adjusting voltage in the SRAM device.

13. The SRAM device of claim 8, wherein the bank of tunable sleep mode diodes are connected to a shunt device that places the SRAM device into or out of a sleep mode.

14. A method of adjusting voltage in a SRAM memory device comprising:
   determining whether the SRAM device is in sleep mode;

determining process conditions while the SRAM device is in sleep mode; and adjusting voltage of the SRAM device based on the determined process conditions in order to minimize leakage effects.

15. The method of claim 14, wherein the determining process conditions is based on feedback as to operating frequency of the SRAM device.

16. The method of claim 14, wherein the adjusting voltage is to a $V_{DD}$ rail connected to a bit cell array of the SRAM device.

17. The method of claims 14, wherein the adjusting is to a $V_{SSM}$ rail connected to a bit cell array of the SRAM device, and reducing potential across bit cells of the bit cell array.

* * * * *